United States Patent
Chen et al.

(10) Patent No.: US 7,752,348 B2
(45) Date of Patent: Jul. 6, 2010

(54) MOTHERBOARD FOR SUPPORTING DIFFERENT TYPES OF MEMORIES

(75) Inventors: Chun-Sheng Chen, Taipei Hsien (TW);
Shou-Kuo Hsu, Taipei Hsien (TW);
Cheng-Shien Li, Taipei Hsien (TW);
Duen-Yi Ho, Taipei Hsien (TW);
Yu-Chang Pai, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 76 days.

(21) Appl. No.: 11/952,139

(22) Filed: Dec. 7, 2007

(65) Prior Publication Data

US 2009/0046418 A1    Feb. 19, 2009

(30) Foreign Application Priority Data

Aug. 17, 2007   (CN) .................... 2007 1 0201389

(51) Int. Cl.
*G06F 3/00* (2006.01)
*H05K 7/10* (2006.01)
(52) U.S. Cl. ....................... 710/16; 361/767
(58) Field of Classification Search ............... 710/16, 710/301; 711/115; 361/767
See application file for complete search history.

(56) References Cited

U.S. PATENT DOCUMENTS

| | | | |
|---|---|---|---|
| 6,424,555 B1 * | 7/2002 | Chang | 365/63 |
| 6,742,067 B2 * | 5/2004 | Hsien | 710/301 |
| 7,133,297 B2 * | 11/2006 | Yu et al. | 361/803 |
| 2007/0134960 A1 * | 6/2007 | Mizoguchi et al. | 439/159 |
| 2007/0263475 A1 * | 11/2007 | Bartley et al. | 365/233 |
| 2008/0082751 A1 * | 4/2008 | Okin et al. | 711/115 |
| 2008/0225499 A1 * | 9/2008 | Meng et al. | 361/767 |

FOREIGN PATENT DOCUMENTS

CN    1180331 C    12/2004

OTHER PUBLICATIONS

Gabriel Torres, "Gigabyte GA-P35C-DS3R Motherboard Review," Aug. 13, 2007, pp. 1-44, http://www.hardwaresecrets.com/article/476.*

* cited by examiner

*Primary Examiner*—Niketa I Patel
*Assistant Examiner*—Farley J Abad
(74) *Attorney, Agent, or Firm*—Frank R. Niranjan

(57) ABSTRACT

A motherboard includes a first slot arranged for mounting a first type of memory, a second slot arranged for mounting a second type of memory, and a voltage regulating circuit electronically connected to the first slot and the second slot. The first memory and the second memory are alternatively mounted on the motherboard, the voltage regulating circuit detects which type memory is currently mounted on the motherboard and outputs voltages suitable for the type of the memory mounted on the motherboard accordingly.

6 Claims, 1 Drawing Sheet

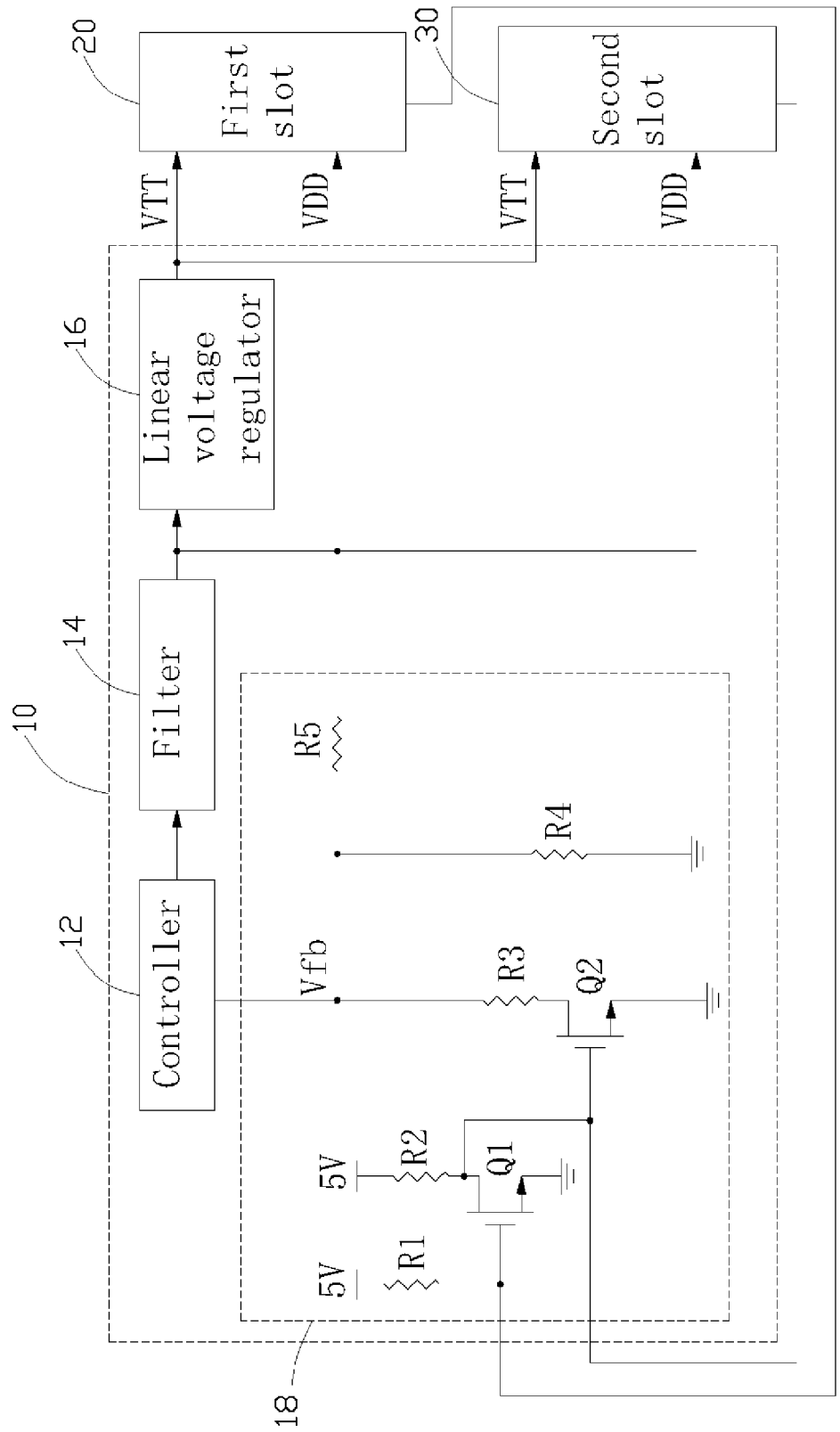

MOTHERBOARD FOR SUPPORTING DIFFERENT TYPES OF MEMORIES

CROSS-REFERENCES TO RELATED APPLICATION

Relevant subject matter is disclosed in a co-pending U.S. patent application Ser. No.11/952,140, filed on the same date and entitled "MOTHERBOARD", and a co-pending U.S. patent application with application Ser. NO. 11/766,105, filed on the Jun. 21, 2007, and entitled "MOTHERBOARD", which are assigned to the same assignee as this patent application.

BACKGROUND

1. Field of the Invention

The present invention relates to motherboards, and particularly to a motherboard for supporting different types of memories.

2. Description of Related Art

Currently, a typical personal computer comprises a motherboard, interface cards, and peripheral accessories. The motherboard is the heart of the personal computer. On the motherboard, in addition to the central processing unit (CPU), the chip set, and the slots for installing the interface cards, it further includes memory module slots for installing memory modules.

Due to constant change in the computer industry, memories used in the computer have changed from DDR2 (Double Data Ram II) used in the past to higher speed memories such as DDR3 (Double Data Ram III).

Because DDR2 is cheaper than DDR3, the main board with DDR2 still is in demand in the market. The difference in operating DDR2 and DDR3 includes: DDR2 utilizes 1.8V VDD and 0.9V VTT, while DDR3 utilizes 1.5V VDD and 0.75V VTT. Currently, no motherboard is compatible with both DDR3 and DDR2. As a result, more motherboards have to be fabricated adding to production cost.

What is needed is to provide a motherboard capable of flexibly supporting different types of memories.

SUMMARY

An exemplary motherboard includes a first slot arranged for mounting a first type of memory, a second slot arranged for mounting a second type of memory, and a voltage regulating circuit electronically connected to the first slot and the second slot. The first memory and the second memory are alternatively mounted on the motherboard, the voltage regulating circuit detects which type memory is currently mounted on the motherboard and outputs voltages suitable for the type of memory mounted on the motherboard accordingly.

Other advantages and novel features of the present invention will become more apparent from the following detailed description of preferred embodiment when taken in conjunction with the accompanying drawing, in which:

BRIEF DESCRIPTION OF THE DRAWINGS

The drawing is a circuit diagram of a motherboard for supporting different types of memories in accordance with the present invention.

DETAILED DESCRIPTION

Referring to the drawing, a motherboard for supporting different types of memories in accordance with an embodiment of the present invention includes a voltage regulating circuit 10, a first slot 20, and a second slot 30. The first slot 20 is used for installing a first memory, such as a DDR2 memory. The second slot 30 is used for installing a second memory, such as a DDR3 memory. The first slot 20 includes a ground terminal to generate a ground signal when the first memory is mounted in the first slot 20. The second slot 30 includes a ground terminal to generate a ground signal when the second memory is mounted in the second slot 30. The first memory and the second memory are alternatively mounted on the motherboard.

The voltage regulating circuit 10 comprises a controller 12 having a feedback terminal and an output terminal, a filter 14 having an input terminal and an output terminal, a linear voltage regulator 16, and a feedback circuit 18. The output of the controller 12 is connected to the input terminal of the filter 14, and the filter 14 outputs a VDD voltage at the output terminal thereof. The VDD voltage is transmitted to the linear voltage regulator 16, and is converted into a VTT voltage transmitted to the first slot 20 and the second slot 30. The output terminal of the filter 14 is connected to the first slot 20 and the second slot 30 to provide the VDD voltage.

The feedback circuit 18 comprises two transistors Q1 and Q2, four resistors R1~R4, and a feedback resistor R5. The transistors Q1 and Q2 are PMOS transistors. The gate of the transistor Q1 is connected to the ground terminal of the first slot 20 and to a 5V power source via the resister R1. The source of the transistor Q1 is grounded. The drain of the transistor Q1 is connected to the 5V power source via the resistor Q2 and to the gate of the transistor Q2. The gate of the transistor Q2 is connected to the ground terminal of the second slot 30. The source of the transistor Q2 is grounded. The drain of the transistor Q2 is grounded via the resistors R3 and R4 in turn and also connected to the feedback terminal of the controller 12 via the resistor R3. The feed back resistor R5 is connected between the output terminal of the filter 14 and the feedback terminal of the controller 12. The resistances of the resistors R1 to R4 are approximately 4.7 Kohms, 4.7 Kohms, 2.4 Kohms, and 1.2 Kohms respectively, and the resistance of the feedback resistor R5 is approximately 1.1 Kohms. The operation of the feedback circuit 18 is premised upon the fact that the level of the feedback voltage Vfb is stable, in this preferred embodiment, the level of the feedback voltage Vfb is 0.78V.

When the DDR2 memory is mounted in the first slot 20, the second slot 30 is idle. The ground terminal of the first slot 20 generates a ground signal. The transistor Q1 is turned on, and the transistor Q2 is turned off. According to the following formula: $VDD=Vfb*(R5+R4)/R4$, the voltage output from the controller 12 is 1.8V. The voltage is provided to the filter 14, which filters and rectifies the voltage to provide a smooth voltage output. The VDD is provided to the feedback circuit 18 and the DDR2 memory mounted in the first slot 20. The linear voltage regulator 16 is configured to receive the VDD voltage and provide a regulated output voltage of VTT (0.9V), which is provided to the DDR2 memory.

When the DDR3 memory is mounted on the second slot 30, the first slot 20 is idle. The ground terminal of the second slot 30 generates the ground signal. The transistor Q1 is turned off, the transistor Q2 is turned on, and the resistor R3 is connected in the circuit. According to the following formula: $VDD=Vfb*(R5+Rx)/Rx$, wherein $Rx=(R3+R4)/R3*R4$, the voltage output from the controller 12 is 1.5V. The voltage is provided to the filter 14, which filters and rectifies the voltage to provide a smooth voltage output. The VDD is provided to the feedback circuit 18 and the DDR3 memory mounted in the second slot 30. The linear voltage regulator 16 is configured to receive the VDD voltage and provide a regulated output voltage of VTT (0.75V), which is provided to the DDR3 memory.

Thus, the motherboard is capable of utilizing either the DDR2 or the DDR3, thus enhancing production capability and reducing production cost.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appterminaled claims are expressed.

What is claimed is:

1. A motherboard for supporting different types of memories, comprising:

a first slot mounting a first type of memory, the first slot comprising a ground terminal generating a ground signal when the first type of memory is mounted therein;

a second slot mounting a second type of memory, the second slot comprising a ground terminal generating the ground signal when the second type of memory is mounted therein, wherein the first memory and the second memory are alternatively mounted on the motherboard; and a voltage regulating circuit electronically connected to the first slot and the second slot to detect which type of memory is mounted on the motherboard by receiving the ground signal generated by the slots, and output voltages suitable for the detected type of memory mounted on the motherboard, the voltage regulating circuit comprising:

a feedback circuit receiving the ground signal from the ground terminal of the first slot or the second slot and outputting a constant feedback voltage according to the ground signal;

a controller comprising a feedback terminal to receive the constant feedback voltage and an output terminal to output a first voltage to the first slot or the second slot; and a linear voltage regulator comprising an input terminal to receive the first voltage from the output terminal of the controller and convert the first voltage to a second voltage, and an output terminal to output the second voltage to the first slot or the second slot.

2. The motherboard as claimed in claim 1, wherein the voltage regulating circuit comprises:

a filter comprising an input terminal connected to the output terminal of the controller to receive the first voltage from the controller, and an output terminal connected to the first slot and the second slot to provide the first voltage to the first slot and the second slot via filtering, a feedback resistor is connected between the output terminal of the filter and the feedback terminal of the controller; and the feedback circuit comprising a first transistor and a second transistor, the gate of the first transistor connected to the ground terminal of the first slot and to a power source via a first resistor, the source of the first transistor grounded, the drain of the first transistor connected to the power source via a second resistor and to the gate of the second transistor, the gate of the second transistor also connected to the ground terminal of the second slot, the source of the second slot grounded, the drain of the second transistor grounded via a third resistor and a fourth resistor in turn and also connected to the feedback terminal of the controller via the third resistor.

3. The motherboard as claimed in claim 2, wherein the first transistor and the second transistor are P-type metal oxide semiconductor (PMOS) transistors.

4. The motherboard as claimed in claim 2, wherein the resistances of the first to the fourth resistors are 4.7 Kohms, 4.7 Kohms, 2.4 Kohms, and 1.2Kohms respectively, and the resistance of the feedback resistor is 1.1 Kohms 5. The motherboard as claimed in claim 2, wherein a feedback voltage at the feedback terminal of the controller is 0.78V.

6. The motherboard as claimed in claim 2, wherein the first slot is a Double-data-rate2 (DDR2) slot, and the second slot is a Double-data-rate3 (DDR3) slot.

* * * * *